(12) United States Patent
Steffan et al.

(10) Patent No.: US 6,284,553 B1
(45) Date of Patent: Sep. 4, 2001

(54) LOCATION DEPENDENT AUTOMATIC DEFECT CLASSIFICATION

(75) Inventors: Paul J. Steffan, Elk Grove; Allen S. Yu, Fremont, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/251,012

(22) Filed: Feb. 16, 1999

(51) Int. Cl.[7] ................................................. G01R 31/26
(52) U.S. Cl. ............................................................ 438/14
(58) Field of Search ................................ 438/14, 15, 7; 324/158.1, 765; 454/187

(56) References Cited

U.S. PATENT DOCUMENTS 5,719,495 * 2/1998 Moslehi ........................... 324/158.1
6,092,846 * 7/2000 Lin ....................................... 382/145

* cited by examiner

Primary Examiner—John F. Niebling
Assistant Examiner—Andre C Stevenson
(74) Attorney, Agent, or Firm—H. Donald Nelson

(57) ABSTRACT

A method of manufacturing semiconductor devices wherein defects on each layer of a semiconductor wafer are determined to be killer or non-killer defects by correlating critical area information on a die with defect size and classification information. The killer/non-killer defect information is tabulated in a defect table from which statistical yield predictions can be made.

8 Claims, 4 Drawing Sheets

LOCATION DEPENDENT AUTOMATIC DEFECT CLASSIFICATION

BACKGROUND OF THE INVENTION

1. Field of the Invention

This invention relates generally to a method of manufacturing high performance semiconductor devices. More specifically, this invention relates to a method of inspecting semiconductor devices during manufacturing. Even more specifically, this invention relates to a method of classifying defects identified during the inspection of semiconductor devices. And even more specifically, this invention relates to a method of assigning location dependent classifications to defects identified during the inspection of semiconductor devices.

2. Discussion of the Related Art

In order to remain competitive, a semiconductor manufacturer must continually increase the performance of the semiconductor integrated circuits being manufactured and at the same time, reduce the cost of the semiconductor integrated circuits. Part of the increase in performance and the reduction in cost of the semiconductor integrated circuits is accomplished by shrinking the device dimensions and by increasing the number of circuits per unit area on an integrated circuit chip. Another part of reducing the cost of a semiconductor chip is to increase the yield. As is known in the semiconductor manufacturing art, the yield of chips (also known as die) from each wafer is not 100% because of defects occurring during the manufacturing process. The number of good chips obtained from a wafer determines the yield. As can be appreciated, chips that must be discarded because of a defect increases the cost of the remaining usable chips.

Each semiconductor chip requires numerous process steps such as oxidation, etching, metallization and wet chemical cleaning. In order to etch metal lines, for example, a layer of photoresist is formed on the surface of the semiconductor chips and patterned by developing the photoresist and washing away the unwanted portion of the photoresist. Because the metal lines and other metal structures have "critical" dimensions, that is, dimensions that can affect the performance of the semiconductor chip, the process of forming the photoresist pattern for each layer is examined during the manufacturing process. Some of these process steps involve placing the wafer on which the semiconductor chips are being manufactured into different tools during the manufacturing process. The optimization of each of these process steps requires an understanding of a variety of chemical reactions and physical processes in order to produce high performance, high yield circuits. The ability to view and characterize the surface and interface layers of a semiconductor chip in terms of their morphology, chemical composition and distribution is an invaluable aid to those involved in research and development, process, problem solving, and failure analysis of integrated circuits.

In the course of modern semiconductor manufacturing, semiconductor wafers are routinely inspected using "scanning" tools to find defects. The scanning tool determines the location and other information concerning defects that are caught and this information is stored in a data file for later recapture and inspection of any of the defects. These data files are stored in a relational database that has the ability to generate wafer maps with defects shown in their relative positions. The data database typically has the ability to send these wafer map files to various review tools within the manufacturing plant. This is very useful as it allows for re-inspection on various after-scan inspection tools within the manufacturing plant. These inspection tools include Optical Microscopes and Scanning Electron Microscopes (SEMs) that allow for classification of the defects. Images taken on the various after-scan inspection tools can be linked by linkage data to the defect on a wafer map and reviewed at a workstation at the convenience of an engineer or technician.

In order to be able to quickly resolve process or equipment issues in the manufacture of semiconductor products, a great deal of time, effort and money is expended on the capture and classification of silicon based defects. Once caught and properly described, work can begin in earnest to resolve the cause, to attempt elimination, and to determine adverse effects on device parametrics and performance. The over-riding difficulty to date is the training and maintaining a cadre of calibrated human inspectors who classify all defects consistently and without error. One of the frustrations of human classifiers can be attributed to the inability to isolate or extract the defect in question from its original background environment.

In an attempt to overcome this problem, optical scan tools are used to review defects captured by the scan tools and can be programmed to automatically classify the captured defects. For example, an optical scan tool can use a comparative method to isolate defects so they can be classified. The comparative method uses a reference die or cell to "look" for a difference between the reference and the current image. The difference is the so-called defect. The scan tool is often able to detect differences between the reference and current image, which it calls defects, which are not discernable by the human defect classifier.

In the typical automatic defect classification methodology, defects are recaptured and reviewed on an optical review tool and automatically classified. The classification information is sent to a relational database where it can be retrieved by a defect management system for further processing, analysis, off-line viewing, charting and other analysis procedures. However, this classification methodology can not determine whether a defect is a "killer" defect unless the defect is relatively large. This is because certain size or certain type defects on one portion of the die can be a killer defect whereas, on another portion of the die the same defect would not be a killer defect. Each die have various areas that can accommodate different size defects and different types (or classifications) of defects.

Therefore, what is needed is an inspection methodology that would have the capability to correlate captured defects to the different critical areas of the die.

SUMMARY OF THE INVENTION

According to the present invention, the foregoing and other object and advantages are attained by a method of manufacturing high performance semiconductor integrated devices in which defects are determined to be killer or non-killer defects.

In accordance with an aspect of the invention, a layer on a lot of semiconductor wafers is processed, at least one inspection wafer is selected from the lot of semiconductor wafers and defect information is generated and input to a defect management system. The defects are reviewed on review and classification tools and defect classification information is input to the defect management system. Critical area information for the device and layer is generated and input into the defect management system where the defect classification information is correlated with the critical area information to determine whether each defect is a killer or a non-killer defect.

In another aspect of the invention, the killer or non-killer defect information is tabulated in a defect table and is tabulated according to layer.

In another aspect of the invention, the tabulated defect table information is utilized to determine statistical yield predictions.

The method of the present invention thus effectively provides a semiconductor manufacturing process for the manufacture of high performance integrated circuits that provides location dependent automatic defect classification that can be utilized to provide statistical yield prediction.

The present invention is better understood upon consideration of the detailed description below, in conjunction with the accompanying drawings. As will become readily apparent to those skilled in the art from the following description, there is shown and described an embodiment of this invention simply by way of illustration of the best mode to carry out the invention. As will be realized, the invention is capable of other embodiments and its several details are capable of modifications in various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiments when read in conjunction with the accompanying drawings, wherein:

DETAILED DESCRIPTION

Reference is now made in detail to a specific embodiment of the present invention, which illustrates the best mode presently contemplated by the inventors for practicing the invention.

Figure 1:
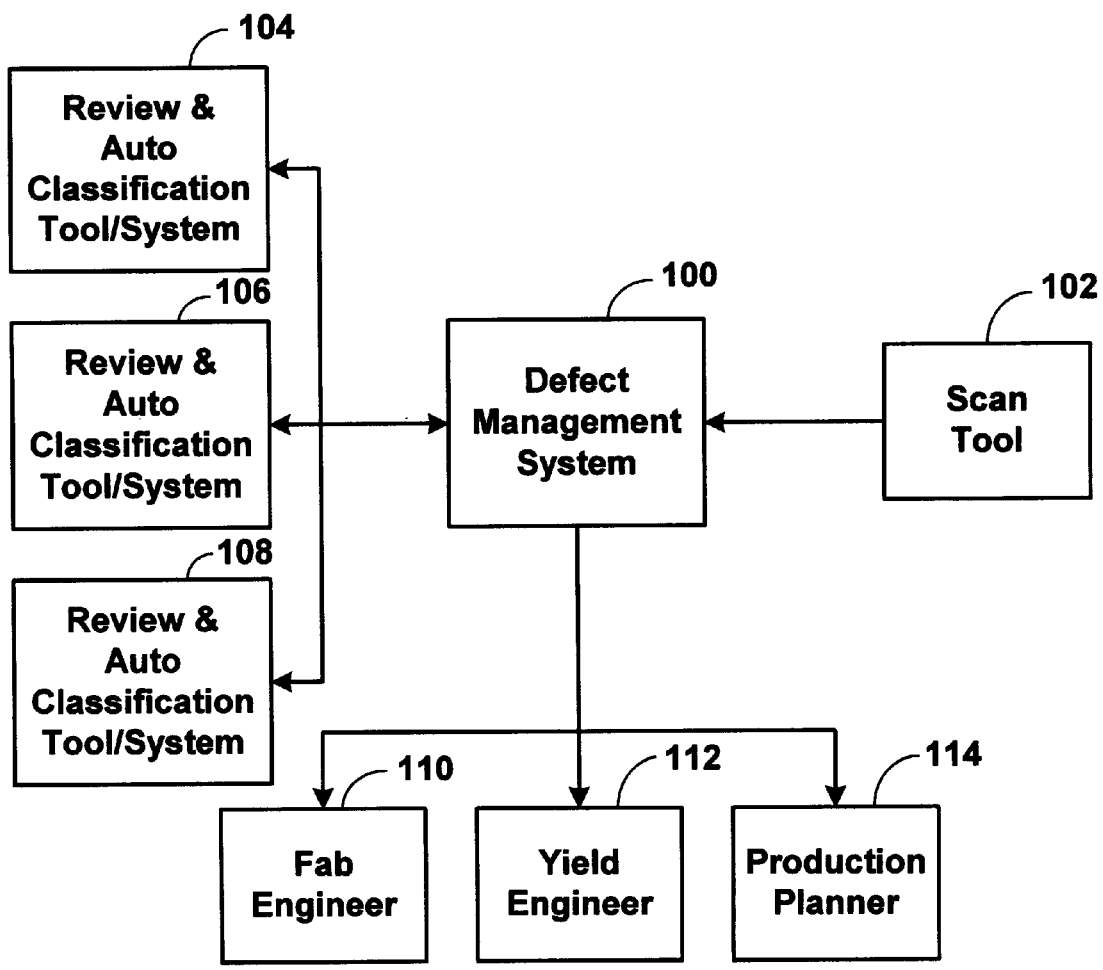
FIG. 1 illustrates a typical inspection methodology showing a defect management system, review and automatic classification tools, a scan tool and various analysis stations.

FIG. 1 illustrates a typical inspection methodology showing a defect management system 100 having input from a scan tool 102 and outputs and inputs to and from review and automatic classification tool systems 104, 106 and 108, and outputs to various analysis stations 110, 112, and 114. The methodology includes placing a wafer in the scan tool 102 after a process is completed on a layer of the wafer. The scan tool 102 sends defect information to the defect management system 100. The defect information includes spatial location of the defect on the wafer and includes an image of the defect and location of the defect information in memory. The review and automatic classification tool systems 104, 106, and 108 are sent defect information and the review and automatic classification tool systems 104, 106, and 108, which have been programmed by a system administrator, classify the defects and send the classification information back to the defect management system 100. The defect information, including the classification information is available for analysis by various stations, including a station manned by a fabrication engineer 110, a station manned by a yield engineer 112 and a station manned by a production planner 114.

Figure 2:
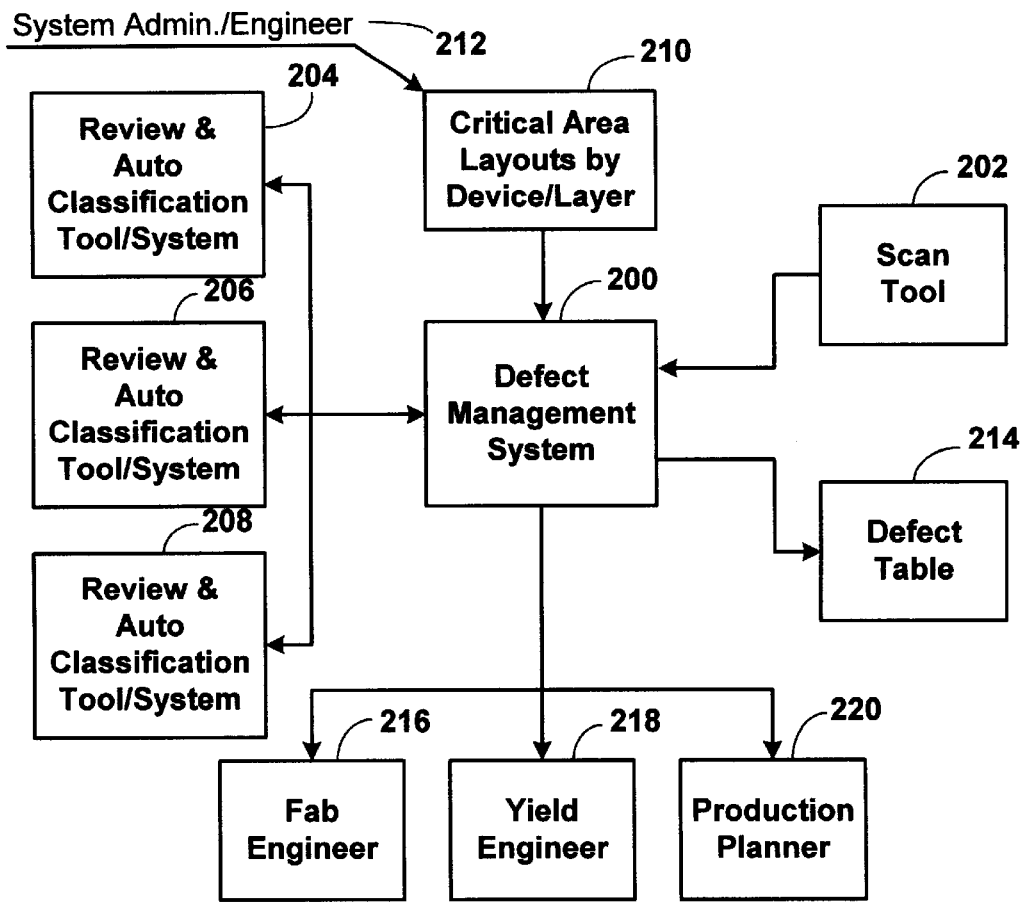
FIG. 2 illustrates an inspection methodology in accordance with the present invention showing a defect management system having inputs of critical area layout by device and layer, review and automatic classification tools, a scan tool and various analysis stations.

FIG. 2 illustrates an inspection methodology in accordance with the present invention showing a defect management system 200 having input from a scan tool 202 and outputs and inputs from review and automatic classification tools systems 204, 206, and 208. The methodology includes placing a wafer in the scan tool 202 after a process is completed on a layer of the wafer. The scan tool 202 sends defect information to the defect management system 200. The defect information includes spatial location of the defect on the wafer and includes an image of the defect and location of the defect information in memory. The defect management system 200 also has input from a data base table 210 containing information of critical area layouts by device and by layer. The data base table 210 is built by information input by a system administrator or a system engineer, as indicated at 212. The information of critical area layouts includes information concerning what size and what kind of defects would be considered killer defects in each of the critical areas. The review and automatic classification tool systems 204, 206, and 208, which have been programmed by a system administrator, classify the defects and send the classification information back to the defect management system 200. The defect management system 200 correlates information received from the review and automatic classification tool/systems 204, 206, and 208 with information from the critical area data base table 210 and determines whether a defect is a killer defect. The information concerning whether a defect is a killer defect is sent to a defect table 214. The defect information, including the classification information and the defect killer information is available for analysis by various stations, including a station manned by a fabrication engineer 216, a station manned by a yield engineer 218 and a station manned by a production planner 220.

Figure 3:
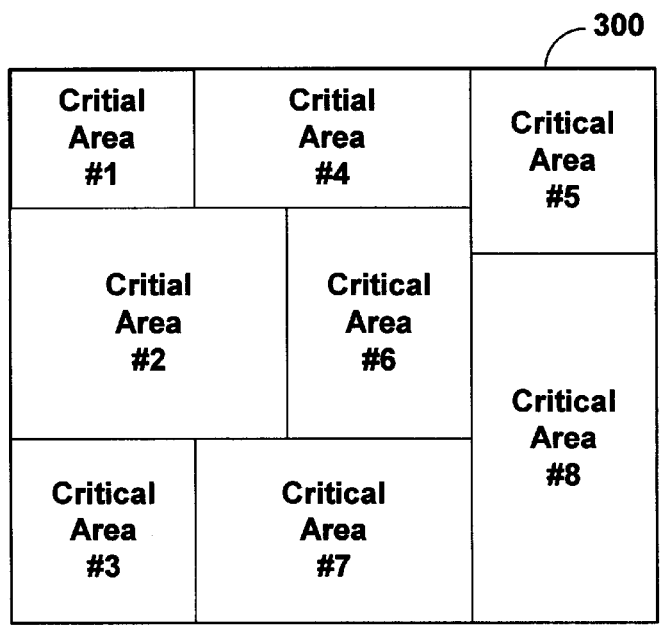
FIG. 3 shows a die with representative critical areas shown on the die.

FIG. 3 shows a die 300 with representative critical areas 1–9 indicated on the die. For example, information concerning critical area #1 would include what type (classification) of defect and what size of defect would be considered a killer defect. A killer defect is defined as a defect that would probably cause the die to fail. An example of a type of killer defect would be a "bridging" defect that would bridge adjacent metal lines causing an electrical short between the two metal lines. Each of the critical areas would have information concerning type of defect and size of defects that would kill the die. This information is generated by a system administrator or system engineer by referring to design data including design rules, pitch, etc. The critical area information is tabulated in a critical area table, to be discussed below, for use by the defect management system.

Figure 4:
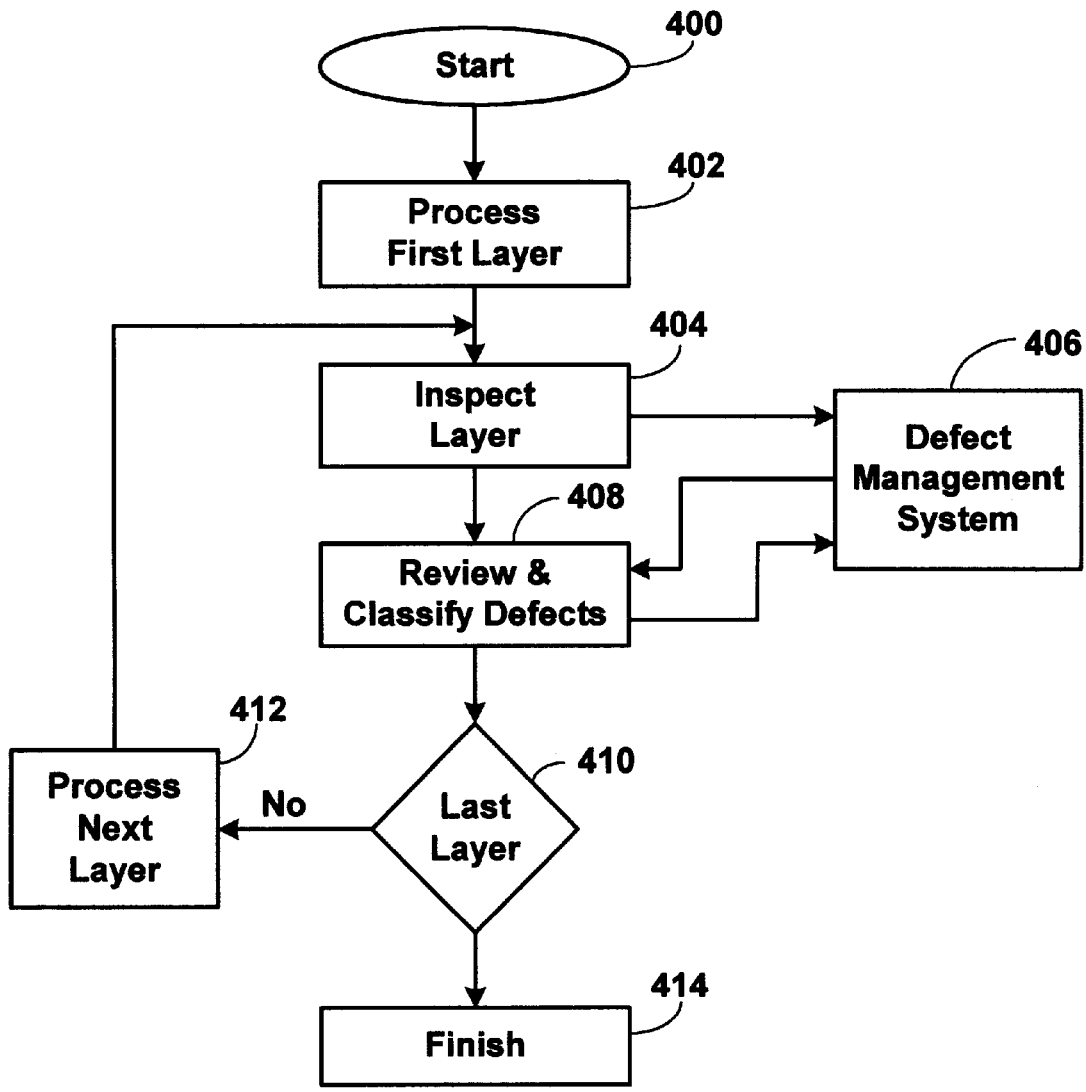
FIG. 4 is a flow diagram of a prior art manufacturing process showing the interaction of a defect management system with the manufacturing process.

FIG. 4 is a flow diagram of a prior art manufacturing process showing the interaction of a defect management system with the manufacturing process. A wafer lot is started through a manufacturing process, as indicated at 400. The first layer of each wafer of the wafer lot is subjected to a first process, as indicated at 402. After the first process is completed, a selected number of wafers are inspected for defects at 404 and are typically referred to as inspection wafers. The defect data is sent to a defect management system 406. The inspection wafers are placed in review and classify tools and the defect management system 406 sends the defect data to review stations 408 where the defects are reviewed and classified. The review stations 408 send the defect classification back to the defect management system 406. After the layer just processed is completed, it is determined at 410 if the layer just processed and inspected is the last layer. If it is determined at 410 that the layer is not the last layer, the next layer is processed, at 412, and the inspection wafers are inspected at 404. If it is determined at 410 that the layer is the last layer, the wafers are finished, as indicated at 414.

Figure 5:
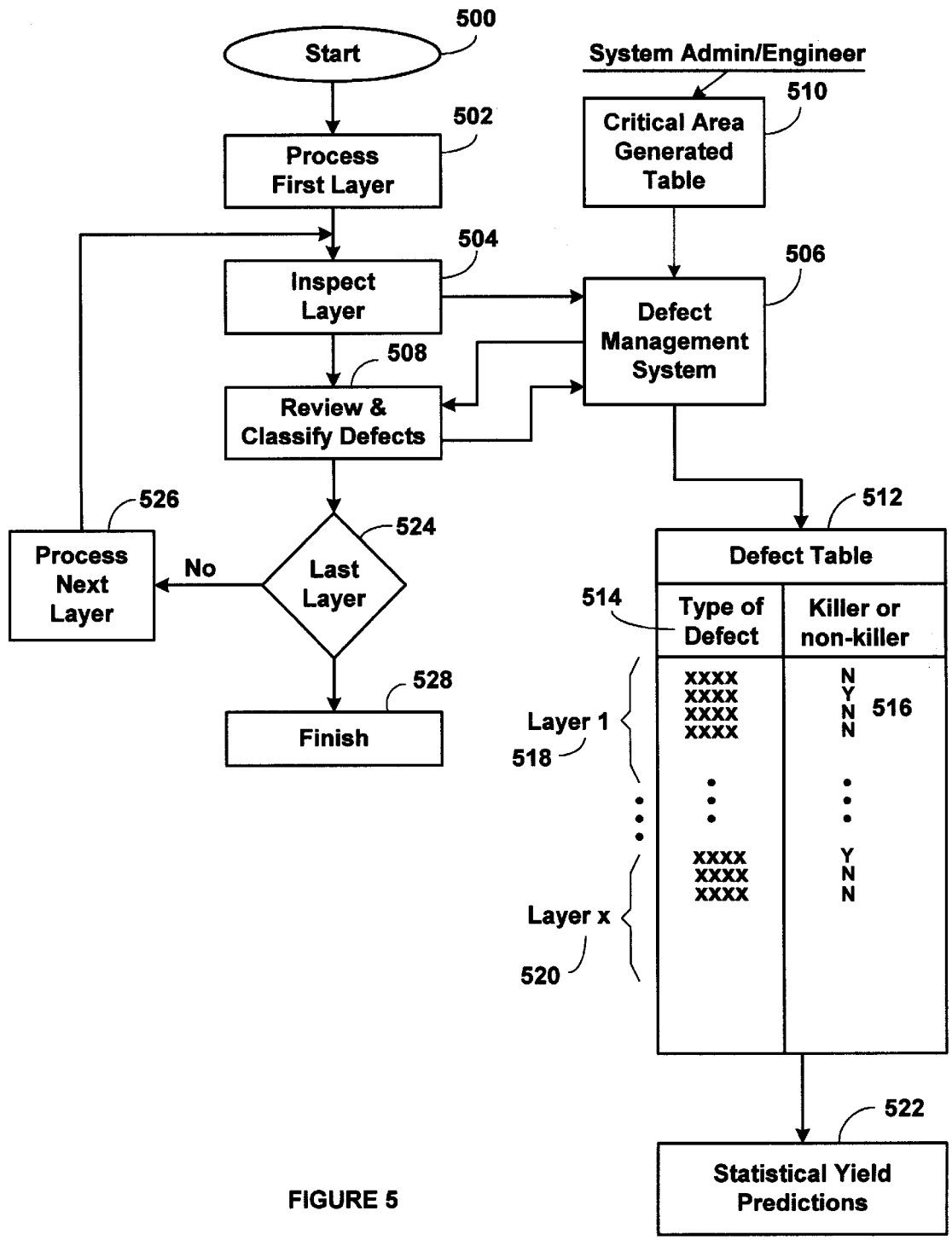
FIG. 5 is a flow diagram of a manufacturing process in accordance with the present invention showing the interaction of the defect management system having an input of data from a critical area generated table and an output to a table listing types of defects per layer and whether the defects are killer defects.

FIG. 5 is a flow diagram of a manufacturing process in accordance with the present invention showing the interaction of a defect management system with the manufacturing process. A wafer lot is started through a manufacturing process, as indicated at 500. The first layer of each wafer of the wafer lot is subjected to a first process, as indicated at 502. After the first process is completed, a selected number of wafers are inspected for defects at 504 in a scan tool that detects defects and determines the spatial location of the defects on the inspection wafer or wafers. The defect data is sent to defect management system 506. The inspection wafers are placed in review and classify stations 508 where the defects are reviewed and classified. The defect management system 506 sends defect information to the review and classify stations at 508. The review stations 508 send the defect classification information back to the defect management system 506 where the defect classification information is correlated with information from critical area generated table 510. The defect management system 506 determines whether each defect is a killer defect by correlating the defect classification information and the critical area information and sends the killer/non-killer to a defect table 512. The defect table 512 tabulates type of defect data 514 and whether it is a killer or non-killer defect 516 along with the layer number, at 518 & 520 that the defect is on. The tabulated data is used to determine statistical yield predictions, at 522. After the layer just processed is completed, it is determined at 524 if the layer just processed and inspected is the last layer. If it is determined at 524 that the layer just processed and inspected is not the last layer, the next layer is processed, at 526, and the inspection wafers are inspected at 526. If it is determined at 524 that the layer is the last layer, the wafers are finished, as indicated at 528.

The benefits of the invention include the following:

1. The ability to predict yield based on accurate, location dependent, defect identification.
2. It reduces the risk of mis-classifying non-critical area defects as killer defects.
3. It allows for easier, more accurate in-line dispositioning of lots on hold for defect related problems.

In summary, the results and advantages of the method of the present invention can now be more fully realized. The method of the present invention thus effectively provides a semiconductor manufacturing process for the manufacture of high performance integrated circuits that provides location dependent automatic defect classification that can be utilized to provide statistical yield prediction.

The foregoing description of the embodiment of the invention has been presented for purposes of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method of manufacturing semiconductor devices, the method comprising:

processing a layer on a lot of semiconductor wafers;

selecting at least one inspection wafer from the lot of semiconductor wafers;

inspecting the layer on the at least one inspection wafer for defects on a scan tool;

generating defect information by the scan tool;

inputting the defect information into a defect management system;

reviewing the defects on the inspection wafers on a review and classification tool;

generating classification information by the review and classification tool;

inputting the classification information to the defect management system;

generating critical area information for each die on the inspection wafer, wherein the critical area information includes what type classification defect and what size defect would be a killer defect for each critical area;

inputting the critical area information into the defect management system;

correlating the classification information with the critical area information to determine killer defect information for each critical area.

2. The method of claim 1 further comprising tabulating the killer defect information in a defect table wherein the killer defect information is tabulated according to layer.

3. The method of claim 2 further comprising determining statistical yield predictions from the tabulated killer defect information.

4. The method of claim 3 wherein the critical area information include defect size and defect classification data related to die area.

5. The method of claim 4 wherein the critical area information further includes information derived from manufacturing design rules for the method of manufacturing.

6. The method of claim 5 further comprising processing and determining the killer defect information for the next layer.

7. The method of claim 6 further determining whether the next layer just processed is the last layer.

8. The method of claim 7 further comprising processing the next layer if the layer just processed is not the last layer.

* * * * *